(12) United States Patent
Zheng et al.

(10) Patent No.: US 12,575,335 B2
(45) Date of Patent: Mar. 10, 2026

(54) SUPERCONDUCTING MICROWAVE FILTERS AND FILTER ELEMENTS FOR QUANTUM DEVICES

(71) Applicant: TECHNISCHE UNIVERSITEIT DELFT, Delft (NL)

(72) Inventors: Guoji Zheng, Delft (NL); Patrick Harvey-Collard, Delft (NL)

(73) Assignee: TECHNISCHE UNIVERSITEIT DELFT, Delft (NL)

( * ) Notice: Subject to any disclaimer, the term of this patent is extended or adjusted under 35 U.S.C. 154(b) by 536 days.

(21) Appl. No.: 17/995,444

(22) PCT Filed: Apr. 7, 2021

(86) PCT No.: PCT/EP2021/059099
§ 371 (c)(1),
(2) Date: Oct. 4, 2022

(87) PCT Pub. No.: WO2021/204897
PCT Pub. Date: Oct. 14, 2021

(65) Prior Publication Data
US 2023/0138353 A1     May 4, 2023

(30) Foreign Application Priority Data
Apr. 7, 2020     (NL) ...................................... 2025291

(51) Int. Cl.
*H10N 69/00*     (2023.01)
*G06N 10/40*     (2022.01)
(Continued)

(52) U.S. Cl.
CPC ............. *H10N 69/00* (2023.02); *G06N 10/40* (2022.01); *H01P 1/2039* (2013.01); *H10N 60/0156* (2023.02)

(58) Field of Classification Search
CPC ..... H10N 60/01–0184; H10N 60/0241; H10N 60/10; H10N 60/128; H10N 60/20;
(Continued)

(56) References Cited

U.S. PATENT DOCUMENTS 10,068,184 B1 *   9/2018   Hertzberg .......... H10N 60/0184
10,263,170 B1 *   4/2019   Brink ...................... H01P 7/086
(Continued)

FOREIGN PATENT DOCUMENTS

WO     WO-2019010045 A1 *   1/2019   ............. C03B 32/02

OTHER PUBLICATIONS

Landig, Andreas J., et al. "Coherent spin-photon coupling using a resonant exchange qubit." Nature 560.7717 (2018): 179-184.
(Continued)

*Primary Examiner* — Scott B Geyer
(74) *Attorney, Agent, or Firm* — Mendelsohn Dunleavy PC; Kevin J. Dunleavy

(57) ABSTRACT

A superconducting device is described wherein the device comprises a substrate; a capacitor structure (604) and a superconducting inductor structure (602) disposed on the substrate, the capacitor structure an the superconducting inductor structure forming a superconducting microwave filter structure, in particular a low-pass filter, the superconducting inductor structure including a plurality of nanowires of a superconducting material, each of the plurality of nanowires being galvanically connected to one of a plurality of capacitor electrodes (608) forming the capacitor structure, wherein the cross-sectional dimensions of the plurality of nanowires are selected such that the kinetic inductance of each of the one or more nanowires is larger, preferably substantially larger, than the geometrical inductance of the nanowire.

20 Claims, 8 Drawing Sheets

(51) Int. Cl.
  *H01P 1/203* (2006.01)
  *H10N 60/01* (2023.01)

(58) Field of Classification Search
  CPC .... H10N 60/205; H10N 60/207; H10N 60/83;
    H10N 69/00; H10D 1/60–716; H10D
    1/041–048; H10D 1/20; H01P 1/20–219;
    G06N 10/40; H01F 27/00–427
  See application file for complete search history.

(56) References Cited

U.S. PATENT DOCUMENTS

| | | | | |
|---|---|---|---|---|
| 10,665,769 | B2 * | 5/2020 | Caudillo | H10N 60/815 |
| 2011/0128084 | A1 * | 6/2011 | Jin | H03F 3/45188 |
| | | | | 336/105 |
| 2013/0029848 | A1 * | 1/2013 | Gonzalez | H10N 60/12 |
| | | | | 438/665 |
| 2018/0232653 | A1 * | 8/2018 | Selvanayagam | G06N 10/20 |
| 2018/0247974 | A1 * | 8/2018 | Oliver | H10N 60/0241 |
| 2019/0044046 | A1 * | 2/2019 | Caudillo | G06N 10/20 |
| 2019/0228334 | A1 * | 7/2019 | Hertzberg | H10N 60/805 |
| 2020/0028062 | A1 * | 1/2020 | Rosen | H10N 60/0912 |
| 2020/0120812 | A1 * | 4/2020 | Abdo | H05K 3/4644 |
| 2021/0175026 | A1 * | 6/2021 | Adiga | H01H 1/0036 |
| 2021/0305987 | A1 * | 9/2021 | Janett | H10N 60/128 |
| 2022/0021372 | A1 * | 1/2022 | Nakamura | G06N 10/40 |
| 2023/0138353 | A1 * | 5/2023 | Zheng | H10N 60/01 |
| | | | | 257/14 |

OTHER PUBLICATIONS

Mi, X., et al. "Circuit quantum electrodynamics architecture for gate-defined quantum dots in silicon." Applied Physics Letters 110.4, Article 043502 (2017): 1-4.

Samkharadze, Nodar, et al. "Strong spin-photon coupling in silicon." Science 359.6380 (2018): 1123-1127.

Santavicca, Daniel F., et al. "Microwave dynamics of high aspect ratio superconducting nanowires studied using self-resonance." Journal of Applied Physics 119.23, Article 234302 (2016): 1-8.

Scarlino, Pasquale, et al. "All-microwave control and dispersive readout of gate-defined quantum dot qubits in circuit quantum electrodynamics." Physical Review Letters 122.20, Article 206802 (2019): 1-6.

Zheng, G., et al. "Rapid high-fidelity gate-based spin read-out in silicon." arXiv preprint, arXiv:1901.00687v1 (2019): 1-5.

International Search Report and Written Opinion for corresponding International application No. PCT/EP2021/059099; dated Jun. 14, 2021 (17 pages).

* cited by examiner resonator end 125 nm 105 nm

400 μm

SUPERCONDUCTING MICROWAVE FILTERS AND FILTER ELEMENTS FOR QUANTUM DEVICES

FIELD OF THE INVENTION

The invention relates to microwave filters and filter elements, and, in particular, though not exclusively, microwave filters and filter elements comprising a superconducting high-kinetic inductance nanowire, and, optionally, a thin-film overlap capacitor and quantum devices and quantum systems comprising such microwave filters.

BACKGROUND OF THE INVENTION

Systems for quantum computing include quantum devices such as semiconductor quantum dot qubits or superconducting qubits that are coupled to electronic elements, such as input and output structures. To achieve low-loss, high-frequency control of such systems without degrading the coherence time of the quantum states of the quantum devices, the in- and output structures should be located close to the quantum devices, typically on-chip.

For example, a superconducting microwave resonator may be used as an on-chip coupling element between different quantum devices or as a read-out element of a quantum device. Examples of superconducting microwave resonator structures as input-, output- or coupling structures for Josephson junction based qubits are known from U.S. Ser. No. 10/263,170, which describes the use of off-plane superconducting LC tank resonator structures which are capacitively coupled to the low-impedance superconducting qubits using interconnects or bump bonding structures.

Silicon-based nanofabricated quantum devices, such as SiGe quantum dots, are a promising candidate for large-scale integration of semiconductor qubits based on well-developed semiconductor fabrication processes. In contrast to superconducting Josephson junctions, quantum dots are nanostructures which can be controlled at a single electron level. Tunneling-coupled quantum dots may be configured as spin-qubits wherein the exchange coupling between electron spins in the quantum dots can be tuned to perform spin-qubit operations. Typically coupling to a spin-qubit is achieved through spin-charge hybridization, resulting in a relatively weak coupling to a resonator mode of a microwave resonator that is used for read-out. Hence, for accurate resonant read-out, high-impedance resonators are desirable, since their small capacitance produces large electric fields that provide efficient coupling to such spin qubit.

However, gate electrodes that are necessary to form quantum dots in the vicinity of a resonator inadvertently lead to a parasitic capacitance through which microwave photons can leak away, thereby reducing the quality factor of the resonator significantly. This is especially problematic for high-impedance resonators, as parasitic capacitances can be a large fraction of the total capacitance. To mitigate microwave leakage, symmetric or dipolar mode resonators may be used to reduce mode coupling to the gates. Additionally, gate filters may be employed reducing the microwave leakage into the leads.

For example, Mi et al., *Circuit quantum electrodynamics architecture for gate-defined quantum dots in silicon*, Appl. Phys. Lett. 110, 43502 (2017), describe in their article a hybrid device architecture combining double quantum dot (DQD) structures in an Si/SiGe heterostructure using an on-chip superconducting, standard-impedance (approx. 50

Ohm) microwave cavity coupling structure. In this structure, a plunger gate of the DQD is galvanically coupled to the microwave cavity.

To minimize microwave leakage to the environment, microwave LC filters are inserted in the DC bias lines that are used to tune the DQD. Both the resonator structure and the LC filters are formed by etching a 40 nm thick Niobium layer. Each microwave LC filter includes an interdigitated capacitor and a spiral inductor form around the bonding pad that is used to connect the gate electrodes to external electronics outside the refrigerator in which the chip is placed. Each filter has a total footprint of 700×200 micrometer square so that it is not possible to place the filters close to the quantum dots.

The efficacy of these on-chip gate filters has not been demonstrated. Furthermore, the filter designs have a problematic footprint, including a large interdigitated capacitor and a spiral inductor looping around a bonding pad, which becomes especially problematic with a large number of gate lines. Additionally, the spiral inductor requires additional fabrication steps for connecting the planar spiraling inductor structure to the other circuit elements.

Hence, from the above, it follows there is a need in the art for improved planar microwave filters that have a reduced footprint for on-chip integration close to the quantum device. In particular, there is a need in the art for improved planar microwave filters that allow improved tunability of filter parameters, have a reduced footprint, allow easy integration with quantum dot systems and allow effective filtering for high-impedance resonators.

SUMMARY OF THE INVENTION

In this application, superconducting devices comprising highly integrated superconducting microwave filters and filter elements are described. The filters and filter elements are especially suitable as on-chip circuit elements for quantum devices.

In an aspect, the invention may relate to a superconducting device comprising: a substrate, preferably a silicon substrate; at least a capacitor structure and a superconducting inductor structure disposed on the substrate, the at least one capacitor structure and superconducting inductor structure forming a filter structure, preferably a microwave filter structure, the at least one superconducting inductor structure including one or more nanowires of a superconducting material, the at least one capacitor structure comprising one or more first capacitor electrodes and one or more second capacitor electrodes, wherein one end of each of the one or more nanowires is galvanically connected to one of the one or more first capacitor electrodes and, wherein the cross-sectional dimensions of each of the one or more nanowires is selected such that the kinetic inductance of each of the one or more nanowires is larger, preferably substantially larger, than the geometrical inductance of each of the one or more nanowires.

In an embodiment, the one or more first capacitor electrodes are made of a superconducting material, preferably the same superconducting material as the superconducting materials of the one or more nanowires.

In an embodiment, at least one of the one or more first capacitor electrodes and at least one of the one or more second capacitor electrodes may form a thin-film interdigitated capacitor.

In an embodiment, at least one of the one or more first capacitor electrodes and at least one of the one or more second capacitor electrodes form a thin-film overlap capacitor.

Thus, the invention provides compact on-chip filters for quantum devices and the operation thereof. For example, the on-chip filters in the gate electrodes of a quantum dot and in the leads of a high-impedance resonator prevent losses of microwave energy through the gate lines. The inductors are realized as nanowires made of a high-kinetic-inductance superconductor. This way small filter elements such as inductors with large inductance can be placed anywhere on the chip. Similarly, small filter elements in the form of thin-film overlap capacitors may be realized in a single fabrication lithography step. The inductor and capacitor elements substantially reduce the total footprint of the filter structure.

In an embodiment, the one or more first capacitor electrodes includes at least a first thin-film capacitor electrode disposed over the substrate and wherein the one or more second capacitor electrodes includes at least a second thin-film capacitor electrode disposed over the first thin-film capacitor electrode, the superconducting device further comprising a dielectric, preferably a thin-film dielectric layer, disposed between the first and second thin-film capacitor electrode.

In an embodiment, the first and/or second thin-film capacitor electrodes may be made of the same superconducting material as the superconducting material of the one or more nanowires.

In an embodiment, the at least one capacitor structure may comprise a plurality of first capacitor electrodes and at least one second capacitor electrode, the superconducting device further comprising a thin-film dielectric layer disposed over the plurality of first capacitor electrodes and a thin-film metal layer disposed over the dielectric thin-film layer, the thin-film metal layer forming the at least one second electrode of the at least one capacitor structure. Thus, highly integrated filter structures can be realized including one capacitor plate overlapping a plurality of gate lines, effectively producing a very compact filter unit.

In an embodiment, the cross-sectional dimensions of each of the one or more nanowires may be selected such that the kinetic inductance of each of the one or more nanowires is at least 10 times larger than the geometrical inductance of the nanowire, preferably at least a 100 times larger than the geometrical inductance, more preferably at least a 1000 times larger than the geometrical inductance of each of the one or more nanowires.

In an embodiment, the cross-sectional dimensions of each of the one or more nanowires includes a width and a thickness, wherein the width is selected between 10 and 800 nm, preferably 40 and 500 nm, more preferably 50 and 300 nm and wherein the thickness is selected between 4 and 200 nm, preferably between 5 and 100 nm, more preferably between 6 and 50 nm.

In an embodiment, the superconducting material of the one or more nanowires is one of: NbTiN, NbTi, TiN, NbN, NbSn and Nb.

In an embodiment, the at least one capacitor structure and the at least one superconducting inductor structure may form a low-pass microwave filter structure.

In an embodiment, the cut-off frequency of the low-pass microwave filter structure may be selected to be lower than a predefined frequency selected between 1 and 10 GHz, preferably between 2 and 8 GHz. In an embodiment, the predefined frequency may be the frequency of the resonator structure.

In an embodiment, the superconducting device may further comprise: at least one quantum dot structure disposed on or in the substrate, preferably a silicon substrate, a plurality of gate electrodes disposed over the substrate to control the quantum dot structure, wherein each of the gate electrodes includes a nanowire section wherein the width of the gate electrode is reduced to form at least one of the plurality of nanowires of the inductor structure.

In an embodiment, the at least one quantum dot structure is a silicon-based quantum dot structure, preferably a SiGe quantum dot structure or a Silicon-Silicon oxide quantum dot structure.

In an embodiment, the superconducting device further comprises: a superconducting resonator structure connected to the at least one quantum dot structure, preferably the superconducting resonator structure being made of the same superconducting material as the superconducting material of the plurality of nanowires.

The microwave filters according to the embodiments in this application allow simplified microwave engineering by confining the resonator energy of an on-chip resonator to a small area of the chip. The linewidth of a 6.5 GHz resonator can be improved down to 600 kHz using these filters, therefore achieving a loaded quality factor of 10 800. Such low-loss resonators with large coupling to quantum dots allow hybrid spin-superconducting devices to realize long-range two-qubit gates, and/or high-speed gate-based read-out.

In an embodiment, the superconducting inductor structure may be located at a first area of the substrate and the at least a capacitor structure may be located at a second area of the substrate. Preferably the superconducting inductor structure and the at least a capacitor structure are located close to the one or more quantum devices, e.g. at least one quantum dot. In a further embodiment, the low-pass microwave filter structure is a thin-film lumped element filter. The thin-film lumped element filter has a small footprint and well defined capacitance and inductance values which can be placed close to quantum devices on the substrate.

In a further aspect, the invention relates to a solid-state quantum device comprising: one or more quantum devices formed on or in a semiconductor substrate; one or more electrodes connecting bonding pads on the substrate to the one or more quantum devices; each of the one or more electrodes including at least one superconducting filter, wherein the at least one superconducting filter comprises at least a capacitor structure and at least one superconducting inductor structure, the at least one superconducting inductor structure including one or more nanowires of a superconducting material, the at least one capacitor structure comprising one or more first capacitor electrodes and one or more second capacitor electrodes, wherein one end of each of the one or more nanowires is galvanically connected to one of the one or more first capacitor electrodes and wherein the cross-sectional dimensions of each of the one or more nanowires is selected such that the kinetic inductance of each of the one or more nanowires is larger, preferably substantially larger, than the geometrical inductance of each of the one or more nanowires.

In yet a further aspect, the invention relates to a method of fabricating a quantum device comprising: forming a thin-film heterostructure, preferably a semiconductor heterostructure or a semiconductor-insulator heterostructure over a substrate; forming a superconducting layer over the thin-film heterostructure to form a thin-film stack provided on the substrate; forming a first patterned resist layer over the thin-film stack, the first patterned resist layer including a capacitor pattern, an inductor pattern, a connection pattern connecting the capacitor and inductor pattern and quantum device pattern, the inductor pattern including a nanowire pattern; forming a capacitor structure, an inductor structure, a connection structure galvanically connecting the inductor structure with the capacitor structure and a quantum device structure in the thin-film stack using an etching step, preferably a reactive ion etching step; forming a second patterned resist layer over the capacitor structure exposing the top surface of the capacitor structure; and, forming a thin-film capacitor, the forming of the thin-film capacitor including forming a dielectric layer and a metal layer over the second patterned resist layer and removing the second patterned resist layer, wherein the width of the nanowire and thickness of the superconducting layer are selected such that the kinetic inductance of the nanowire structure is larger, preferably substantially larger, than the geometrical inductance of the nanowire structure. The invention will be further illustrated with reference to the attached drawings, which schematically will show embodiments according to the invention. It will be understood that the invention is not in any way restricted to these specific embodiments.

DETAILED DESCRIPTION

Figure 1:
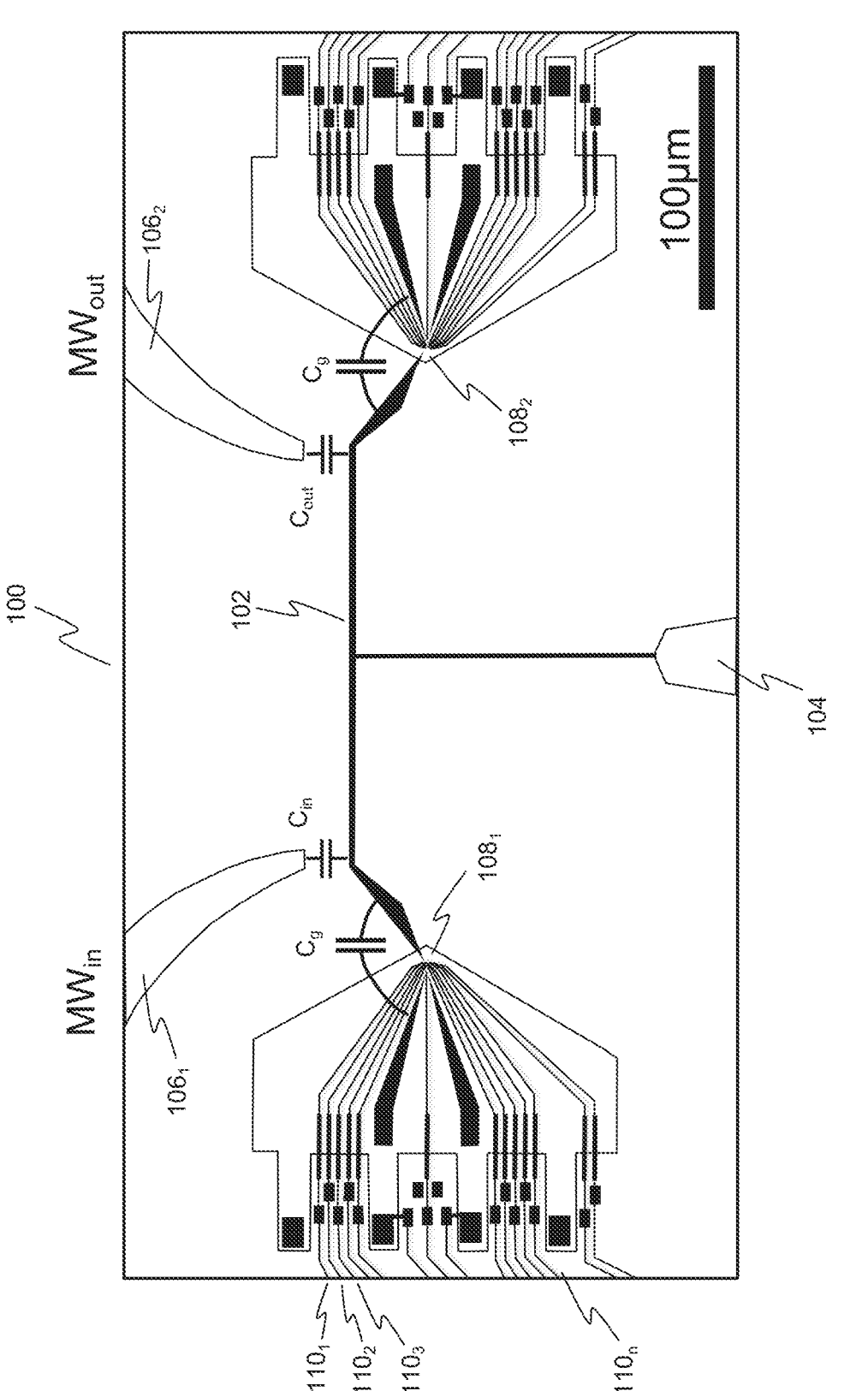
FIG. 1 is an image of part of a chip comprising a quantum device comprising an on-chip resonant structure.

FIGS. 1 and 2 are images of parts of a chip comprising a quantum device comprising an on-chip resonant structure and on-chip filters according to an embodiment of the invention. In particular, the image of FIG. 1 depicts an area of a chip 100 comprising a superconducting resonator structure 102 coupled to one or more quantum devices 108$_{1,2}$. Such quantum devices may include quantum dot (QD) structures and/or superconducting devices that may be controlled as a qubit element. The superconducting resonator may be implemented as a superconducting resonator structure, e.g. superconducting wire or a superconducting nanowire. Such resonator structure may include one or more electrodes for applying a dc signal, e.g. a voltage, to the structure, e.g. a filtered bias electrode 104.

The structure may further include one or more electrodes for applying an ac signal to the structure. The image illustrates for example ac electrodes 106$_{1,2}$ for high-frequency input and output. These ac electrodes may be capacitively coupled to the nanowire resonator wherein the capacitance of the input and output coupling is represented by $C_{in}$ and $C_{out}$, respectively. The superconducting nanowire may be made of superconducting material that exhibits a high-kinetic inductance, such as NbTiN. The superconducting resonator may be designed as a half-wavelength coplanar resonator with a narrow centre conductor and remote ground planes wherein it is remarked that the resonator structure represents just one of many different superconducting resonator structures that may be used in combination with quantum devices.

The superconducting resonator may be coupled to a gate electrode of a quantum device 108$_{1,2}$ (which is not visible in FIG. 1 due to the scale of the optical image). As will be described hereunder in more detail, in an embodiment, a quantum device may be configured as a quantum dot structure that may be realized on the basis of a semiconducting heterostructure including a two-dimensional electron gas (2DEG). Gate electrodes provided over the semiconducting heterostructure may be used to confine the electrons in the 2DEG to one or more quantum dot structures. A plurality of electrodes 110$_{1-n}$ may connect bonding pads to the quantum device. For examples, in case of a quantum dot structure these electrodes may be gate electrodes to control the quantum dot structure, e.g. a double quantum dot (DQD).

Because of the physical footprint of the gates electrodes that lead to the quantum device at each end, an additional stray capacitance $C_g$ may cause microwave energy to escape the resonator through the electrodes in the vicinity of the resonator structure, including the gate electrode and the dc bias electrode. For that reason, on-chip planar low-loss superconducting microwave filter structures are realized in the electrodes that connect the quantum device to the resonator. The microwave filter structures have a small footprint which are especially suitable for use quantum devices and/or input and output structures connected to such quantum devices, such as the resonator structure as for example depicted in FIG. 1.

As will be explained in more detail below, in an embodiment, the filter structures according to the embodiments in this application has one or more inductor elements which are based on one or more superconducting high-kinetic inductance nanowires. Alternatively, and/or in addition, the filter structures according to the embodiments may include one or more capacitor elements which are based on one or more thin-film (overlap) capacitor structures. These filter structures and their advantages are explained below with reference to the figures.

Figures 2A, 2B, 2C:
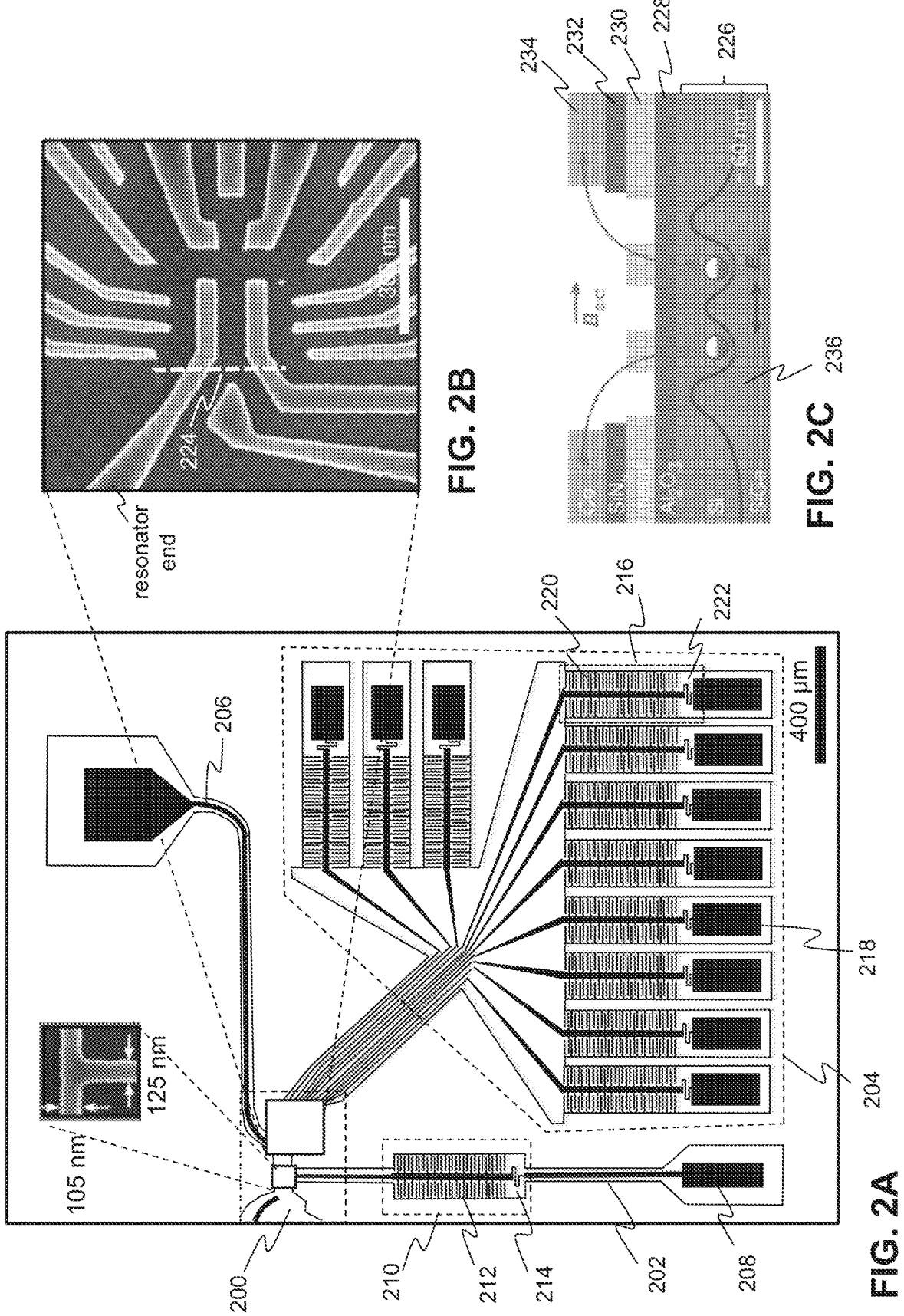
FIG. 2A-2C represents images and a schematic of a quantum device connected to a resonant structure and filters according to an embodiment of the invention.

FIG. 2A-2C depicts a more expanded view of the chip as described with reference to FIG. 1. For example, FIG. 2A represents a zoomed-out part of the chip showing part of gate fanout structure 204, including bonding pads connected via electrodes that lead to the area 200 where a quantum device is located. This area may be referred to as the device area. The device area may for example include a superconducting resonator and quantum dot structures as illustrated in FIG. 1. The superconducting resonator can be controlled by one or more dc electrodes 202 and one or more ac electrodes 206. The dc electrode may include a bonding pad 208, which is connected via an electrode to a filter structure 210. In an embodiment, the filter structure may include a planar microwave low-pass filter, including a superconducting high-kinetic inductance nanowire 214. The filter structure may also include a capacitor, for example a planar interdigitated capacitor 212 as shown in the picture.

The dc bias electrode of the superconducting nanowire resonator provides a galvanic dc connection between the bonding pad, the filter and the resonator structure. The chip may further include a gate electrode area 204, including a plurality of bonding pads, wherein each bonding pad 218 is connected via an on-chip filter structure 216 to an electrode which leads to the device area. These electrodes may for example define gate electrodes of a quantum dot structure. As shown in the image, the on-chip filter structure may include at least an interdigitated capacitor 220 and a superconducting high-kinetic inductance nanowire 222. The filters may be configured as a planar microwave low-pass filter that is configured to isolate the resonant structure at high frequencies from the external environmental effects such as external noise.

The picture at the inset shows a more detailed part of the nanowire resonator (the DC tap section at which a dc electrode is connected to the resonator structure). The picture illustrates typical dimensions of the nanowire which are in the submicron (nanometre) range, i.e. between 10 and 800 nm, preferably between 80 and 600 nm more preferably between 100 and 400 nm.

FIG. 2B depicts a more detailed image of a top-view of the quantum device, in this example, a double quantum dot. The image shows a plurality of gate electrodes that are fabricated over a 2DEG structure, such as known semiconductor heterostructure, e.g. Si/SiGe or other well-known 2DEG heterostructures such as GaAs/AlGaAs, or semiconductor-insulator structures such as SiMOS structures wherein a 2DEG can be formed between the interface of silicon and silicon oxide. The gate electrodes may be operated by dc voltages, thereby forming potential wells in which an electron may be located. The image depicts just one of the many possible quantum dot structures that are suitable in the formation of highly integrated qubit structures.

FIG. 2C depicts a schematic of a cross-section of the chip at the location of the dotted line 224 in FIG. 2B. As shown in this schematic, the chip may include a heterostructure including a 2DEG that can be formed in the Si layer. An insulating (dielectric) layer 228 may be formed over the heterostructure, followed by a patterned metal layer 230 that form the gate electrodes as shown in FIG. 2B. This way, for example, electrons are trapped in a Si quantum well with SiGe buffer and spacer layers.

Additionally, a controlled magnetic field may be applied to the electrons, for example if the quantum dots are going to be operated as spin qubits. To that end, at least over some electrodes an insulating layer 232, e.g. a $Al_2O_3$ or $SiN_x$ dielectric layer, may be formed and a patterned magnetic layer 234, e.g. a Co layer, may form Co micro-magnets on the insulating layer. One of the gates may be connected to the superconducting resonator structure so that an electron in the quantum dot can be coupled to microwave photons. In an experiment, a single electron moves in a double dot potential landscape 236 in response to the resonator electric field. A magnetic field may be applied in the plane of the quantum dots, the Co micromagnets may create an additional magnetic field component with a different orientation between the two dots.

Figure 3:
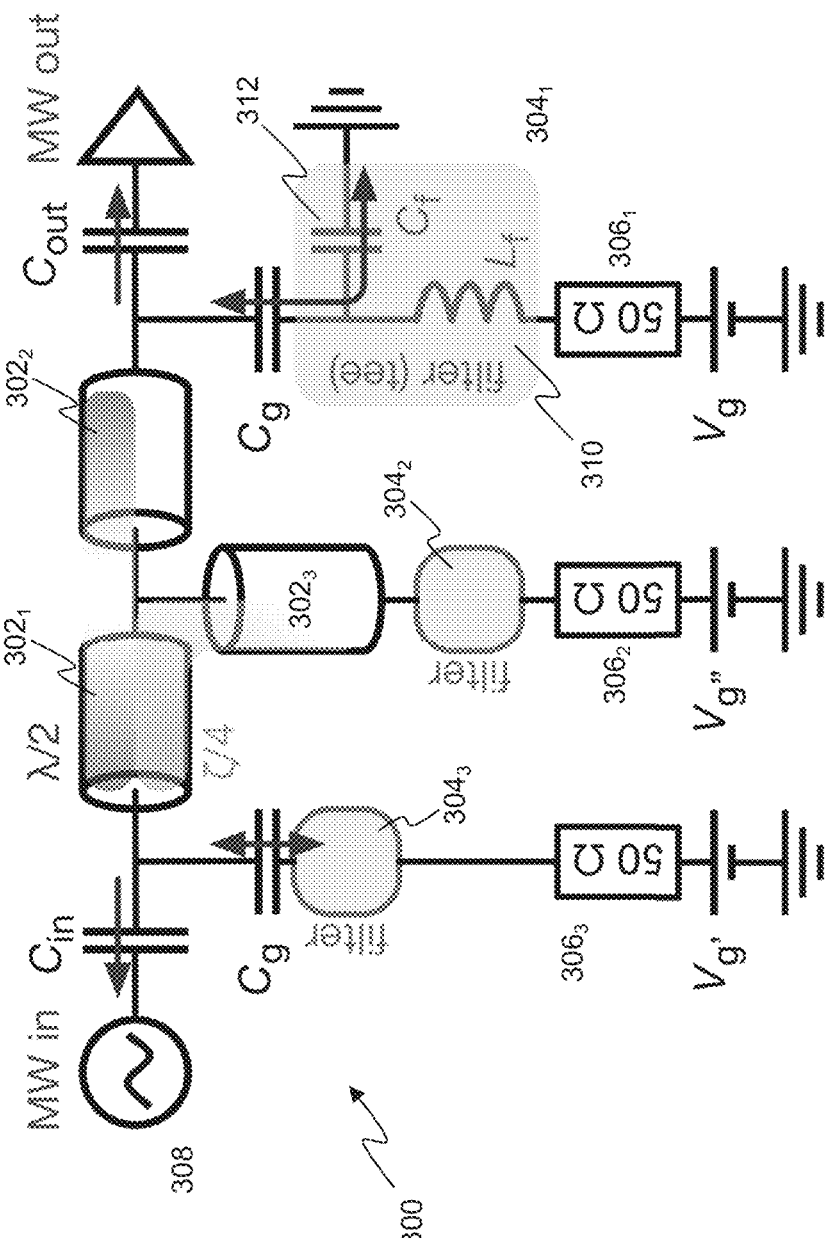
FIG. 3 depicts an electrical circuit of the resonant structure and the filters according to an embodiment of the invention.

FIG. 3 depicts an electrical circuit 300 of a microwave resonator (as for example described with reference to FIGS. 1 and 2) and its surrounding components, including the electrodes coupled to the superconducting resonator and gate electrodes. The resonance modes of the resonator may be modelled based on—in this example—three sections of coplanar waveguides $302_{1-3}$ with appropriate capacitance and inductance per unit length, $\tilde{C}_r$ and $\tilde{L}_r$, respectively. A half-wave mode $\lambda/2$ couples the quantum device, e.g. a quantum dot structure, at each end of the resonator in antiphase, whereas a quarter-wave mode $\zeta/4$ may also exists where the quantum devices at both ends are coupled in phase (only one side of the mode is shown for simplicity).

A microwave read-out circuit 308 structure may be used to probe the state of the quantum device. The probing may be performed in transmission through the "input" and "output" ports with coupling capacitances $C_{in}$ and $C_{out}$, or in reflection (not shown). Because of the physical footprint of the gates that lead to the quantum device at each end of the resonator, an additional stray capacitance $C_g$ associated with these electrode structures may cause microwave energy of the resonator to escape the through the electrodes, in particular the gate fanout electrodes. To prevent leakage of the microwave energy into the resistive part of the electrodes $306_{1-3}$ (which may be modelled by 50 $\Omega$resistors) low-loss, low-pass LC microwave filters $304_{1-3}$ may be fabricated on-chip to reflect the microwaves back into the resonator as schematically depicted by the arrow in filter $304_1$. The inductance $L_f$ 310 and the capacitance $C_f$ 312 of the filters may be determined based on the working frequency of the resonator. For example, for frequencies in the 2-8 GHz range, inductance values in the range of 50-150 nH and capacitance values in the range of 0.1-1 pF are desired.

Figures 4A, 4B, 4C:
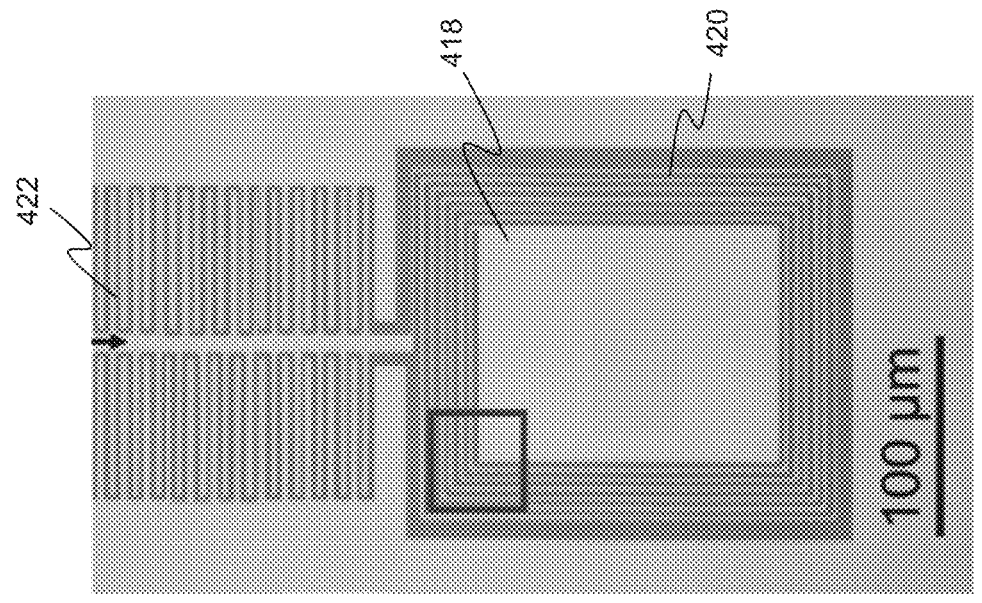
FIG. 4A-4C illustrate a superconducting filter according to an embodiment of the invention and a superconducting filter known from the prior art.

FIG. 4A-4C depict examples of superconducting filter structures. In particular, FIGS. 4A and 4B illustrate a superconducting filter structure according to an embodiment of the invention. In an embodiment, the superconducting filter structure may be a low-pas microwave filter. As shown in the image of FIG. 4A, in this embodiment, the filter structure may be implemented as a co-planar superconducting filter structure, including an inductor structure 404 and an interdigitated capacitor structure including first co-planar interdigitated capacitor electrodes $406_{1,2}$ and second co-planar interdigitated capacitor electrode 407. The inductor structure may be implemented as a superconducting inductor structure, including a high-kinetic-inductance nanowire of inductance $L_f$ connected to a first $402_2$ and second $402_1$ inductor terminal (which is connected to one of the interdigitated co-planar electrodes 407). FIG. 4B depicts an electrical circuit 416 of a LC filter 412 including an inductor 414 between a first and second terminal $410_{1,2}$ and a capacitor 408 connecting the second terminal of the inductor to ground. For the design of FIG. 4A the inductor may have value of about 114 nH and capacitance value of about 0.1 pF.

FIG. 4C depicts an example of a known superconductor filter structure as described in the article by Mi et al. as cited above in the background section of this application. This figure depicts a superconducting LC filter structure, including a bonding pad 418, a spiral inductor 420 oriented around the bonding pad and connected to an interdigitated capacitor structure 422. This structure has a capacitor of 1 pF and an inductor of approx. 13 nH and a footprint of approximately $700\times200$ $\mu m^2$. Comparison of this filter structure based on a spiral inductor ($200\times300$ $\mu m^2$ footprint and an inductance of 13 nH) with the filter structures as shown in FIGS. 4A and 4B shows that a superconducting inductor structure based on a high-kinetic inductance nanowire ($50\times50$ $\mu m^2$ footprint and an inductance of approximately 114 nH) provides substantial reduction of the footprint of the structure enabling the filter to be located closer to the quantum devices.

In an embodiment, the superconducting nanowire may be designed such that its kinetic inductance is larger, preferably substantially larger, than its geometrical inductance. In further embodiments, the kinetic inductance may be at least 10 times the geometrical inductance, 100 times the geometrical inductance or even 1000 times the geometrical inductance. The kinetic inductance of a superconducting wire depends on the wire cross section and the superconducting material the wire is made from.

The kinetic inductance $L_f$ of a nanowire of length l and cross section A may be given by the following expression:

$$L_f = \frac{m_e}{2en} \frac{l}{A}$$

wherein $m_e$ is the electron mass and n is the density of Cooper pairs in the material. For example, a NbTiN nanowire of 100 nm width and 6.5 nm thickness will have a kinetic inductance of $L_k/l \approx 750$ pH/μm. Typically, stable superconducting materials that are resistant to magnetic fields and that have a low Cooper pair density may be selected. Suitable superconducting materials include NbTiN, NbTi, TiN, NbN, Nb$_3$Sn and Nb. Further, typical cross-sectional dimensions of the nanowire may include a width between 10 and 800 nm, preferably 40 and 500 nm, more preferably 50 and 300 nm and a thickness between 3 and 200 nm, preferably between 5 and 100 nm, more preferably between 6 and 50 nm.

During fabrication, a superconducting film may be patterned to form the nanowires of the filters and any other structures, including but not limited to that is also used for fabricating other structures on the same chip, such as resonator structures. The capacitor may be implemented as an interdigitated capacitor having a capacitance $C_f$. The inductance and capacitance structures behave as low-loss circuit elements due to the use of a superconducting material and the absence of amorphous dielectrics. The dimensions of the high-kinetic nanowire inductor may be much smaller than an equivalent spiral inductor which requires looping around a bond pad. These reduced dimensions enable the filter to be located closer to the quantum device.

Figures 5A, 5B:
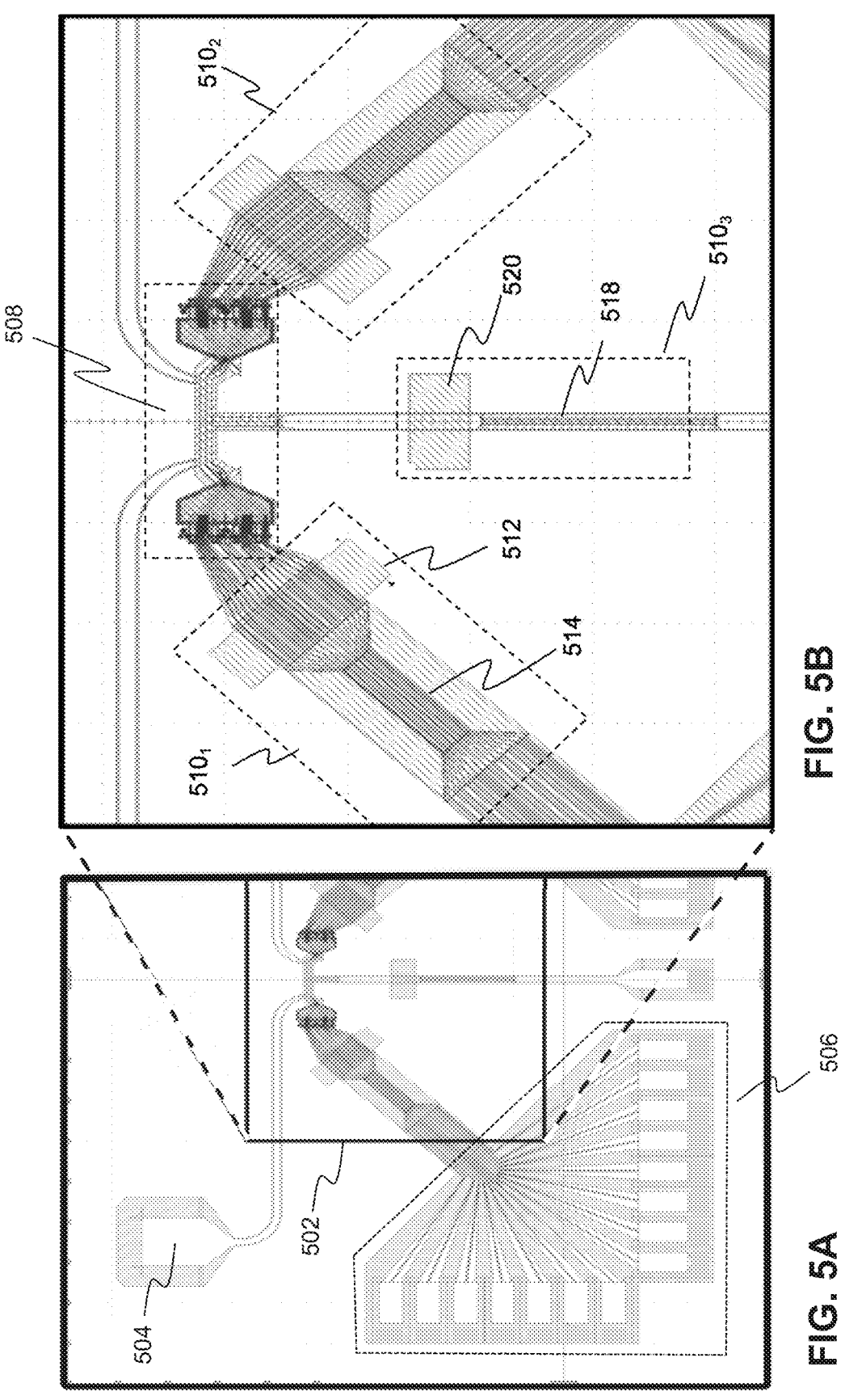
FIGS. 5A and 5B depict part of a chip including a quantum device connected to a resonant structure and filters according to an embodiment of the invention.

FIGS. 5A and 5B depict part of a chip design including of a quantum device connected to a resonant structure and filters according to another embodiment of the invention. FIG. 5A depicts an area of a chip comprising a device area 502 including one or more quantum devices connected to a superconducting resonator connected to ac electrodes and a dc electrode. The ac microwave electrodes may be connected to bonding pads 504. The chip may further include a gate electrode area 506 including bonding pads connected to electrodes leading into the device area 502. In contrast to the chip design in FIGS. 1 and 2, the microwave low-pass microwave filters are not located close to the bonding pads in gate electrode area 506. Instead, the filters are moved closer to the quantum device in the device area 502. The filter design in this embodiment is further illustrated in FIG. 5B which represents an expanded picture of the device area.

As shown in this figure, the device area includes three filter areas $510_{1-3}$ close to the quantum device connected to the resonator. First and second filter area $510_{1,2}$ are integrated into the gate electrodes of the quantum devices, in this example 15 electrodes per quantum device. The first filter area may include area including a plurality of superconducting nanowires 514 wherein each nanowire has a high-kinetic inductance and is connected to a gate electrode of a first quantum device in a similar way as described with reference to FIGS. 1 and 2. The first filter area may further include a thin-film capacitor structure 512 including a plurality of highly integrated capacitors, one for each gate electrode. The thin-film capacitor structure includes a plurality of capacitors wherein each capacitor is defined by a thin-film stack including two capacitor electrodes and a dielectric layer between the electrodes.

This way a plurality of highly integrated LC filters may be formed. In a similar way, the second filter area may form highly integrated LC filters for the gate electrodes of a second quantum device. A third filter area $510_3$ may be integrated in the dc electrode of the resonator and includes a similar filter structure as the filters that are integrated in the gate electrodes, including a superconducting nanowire 518 that has a high-kinetic inductance and a thin-film capacitor 520. As shown in the figures, the use of the thin-film capacitor structure in combination with superconducting nanowire inductors allows realization of microwave filters with a very small footprint so that low-pass microwave filters can be located very close to the actual quantum devices, wherein the filters may include any type of LC circuit including first order and high-order LC filters.

Figures 6A, 6B:
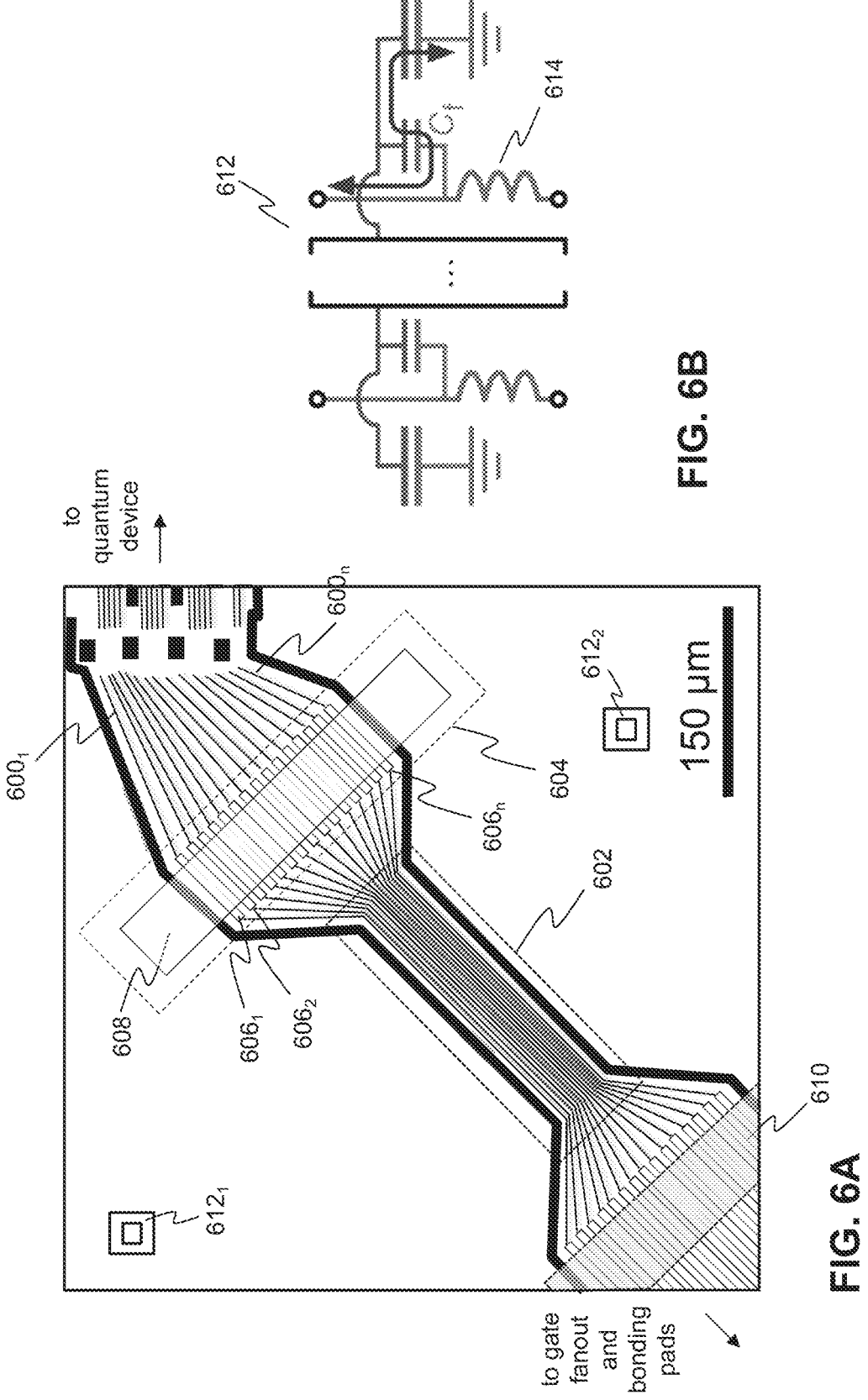
FIGS. 6A and 6B illustrate a superconducting filter according to another embodiment of the invention.

FIGS. 6A and 6B illustrate the filter as described in FIG. 5 in more detail. As shown in the image of FIG. 6A, a filter area may be formed in a gate electrode area close to the actual quantum device. The filter area may include an inductor area 602, a first area on the substrate, comprising an inductor structure and a capacitor area 604, a second area on the substrate, comprising a capacitor structure. The inductor structure may include a plurality of superconducting nanowires each having a high kinetic inductance. The plurality of superconducting nanowires may include a first end and a second end. The capacitance structure may include a plurality of bottom capacitor electrodes $606_{1-N}$, in this example rectangular capacitor electrodes including a first and second end. As shown in the image, the second end of each nanowire may be connected to the first end of each of the capacitor electrodes. The capacitor electrodes may be covered by a dielectric layer (not visible) and a top capacitor electrode 608 provided over the dielectric layer so that it is electrically isolated from the bottom capacitor electrodes. The top capacitor electrode may be a metal layer of a low resistivity, e.g. a gold layer or a superconducting layer. Thus, each gate electrode $600_{1-n}$ is at one end connected to a bonding pad and at the other end connected to part of the quantum device. Each gate line may comprise at least one superconducting nanowire (of the inductor structure) wherein one end of the nanowire is connected to one end of at least one bottom capacitor electrode (of the capacitor structure). This way, each gate electrode comprises at least one integrated microwave LC filter close to the quantum device. As shown by the scale of the image, the footprint of the filter area for the (in this example fifteen) gate lines is dramatically reduced when compared to the total footprint of the LC filters that are based on an interdigitated capacitor as depicted in FIG. 4. The design allows individual setting of the inductance and capacitance of each electrode by controlling the dimensions of the nanowire (length and width) and the dimensions of the bottom electrodes and the top capacitor electrode. This way, high-quality, low loss thin-film lumped element filters, e.g. low-pass microwave filters, may be realized which can be integrated on-chip close to the quantum devices.

FIG. 6B depicts an electric circuit of the filter structure of FIG. 6A. The top electrode 612 is capacitively coupled via a capacitance $C_f$ to an electrode which is connected to a nanowire inductor 614. The capacitor structure couples multiple gate lines at once, thereby dramatically reducing the footprint and simplifying the microwave hygiene. In an embodiment, the top capacitor electrode may be electrically floating to further simplify the integration.

The integrated capacitor and inductor structures shown in FIG. 6A may be used to realize higher-order filters such as an integrated pi-filter, i.e. an C-L-C filter. For example, a second capacitor structure 610 that has a similar structure as the first capacitor structure of first capacitor area 604 may be formed at the first end of the plurality of nanowires of the inductor structure of inductor structure 602. Connecting the top electrode of the first capacitor structure to the top electrode of the second capacitor structure will result in a highly integrated C-L-C filter (pi-filter) very close to the quantum device. Such filter structure can be realized using a relatively simple fabrication step. It is submitted that based on this filter design many different highly integrated on-chip microwave filters may be realized, e.g. low-pass, high-pass, band-pass may be realized without departing from the essence of the invention.

Figure 7B:
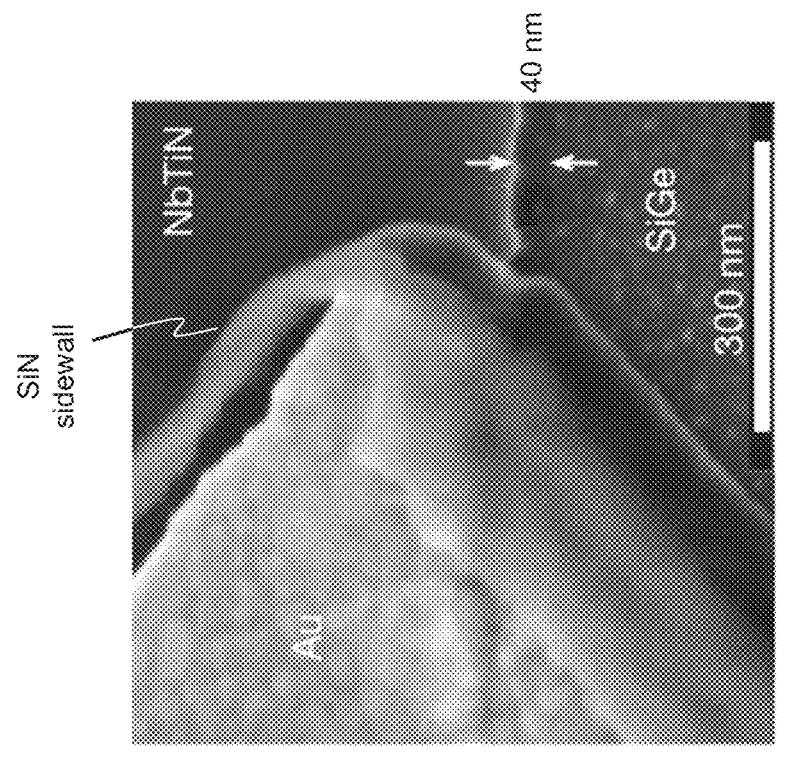
FIGS. 7A and 7B depict a thin-film overlap capacitor structure according an embodiment of the invention.
Figure 7A:
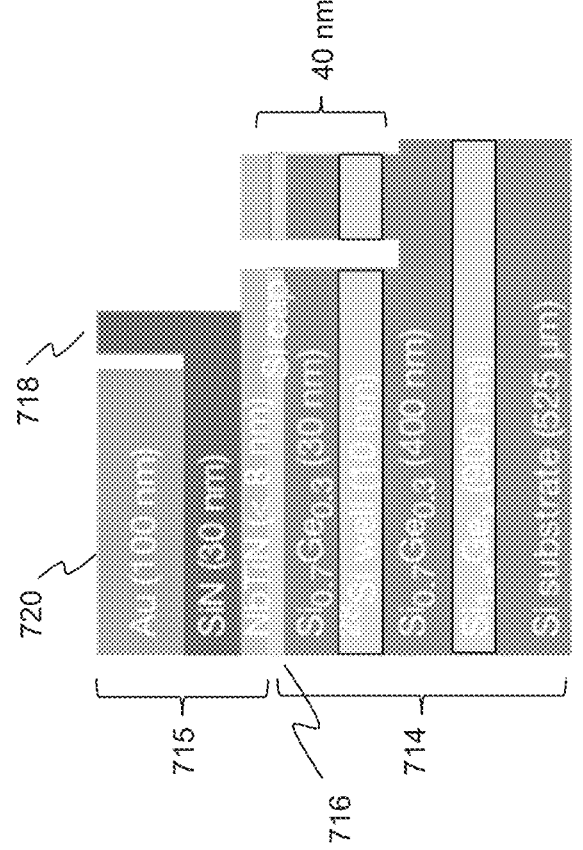

FIG. 7A depicts a cross-section of a thin-film stack that may form a thin-film overlap capacitor structure according to an embodiment of the invention. The thin-film overlap capacitor may be part of a superconducting filter as described with reference to FIGS. 5 and 6. The structure may include a 2DEG structure 714, such as a 2DEG heterostructure, in this example a Si/SiGe heterostructure, including a Si substrate, a SiGe gradient layer, a $^{28}$Si well layer and a $Si_{0.7}Ge_{0.3}$ layer. A 2DEG will be formed at the interface between the $^{28}$Si well and the $Si_{0.7}Ge_{0.3}$ layer. The 2DEG structure may be covered with a capping layer 716, e.g. a Si capping layer, to enable growth of a high-quality thin-film capacitor stack 715. The thin-film capacitor stack may include a first capacitor electrode, e.g. a superconducting metal layer 717, e.g. NbTiN, which is formed in a super-conducting metal film which may be grown on the capping layer. This film may be patterned using well-known semi-conductor processes to form the nanowires and capacitor electrodes for the filter structures and other structures, e.g. a superconducting resonator structure. Further, at the capacitor area a dielectric layer 718, e.g. a $SiN_x$, $SiO_2$ or $Al_2O_3$ layer, may be provided over the capacitor electrodes which form the first (bottom) electrode of the thin-film capacitor structure. Further, a metal, e.g. Au, top electrode 720 may be formed over the dielectric layer thus forming a $NbTiN/SiN_x/Au$ thin film capacitor.

In an embodiment, the capacitor and/or inductor structures as described with reference to FIG. 5-7 may be fabricated in the following way. In a first step, a 2DEG structure, e.g. a quantum well heterostructure, such as a Si/SiGe heterostructure, may be grown on a substrate, e.g. a Si wafer using well-known processes such as chemical vapour deposition. The heterostructure may be covered with a capping layer, e.g. a Si capping layer to protect the heterostructure and to allow growth of further layers on top of the heterostructure.

An example of a SiGe heterostructure comprising various SiGe layers is depicted in FIG. 7A. Further, alignments markers may be realized in or on the substrate using well-known photolithography and etching techniques. For example, a plasma etch may be used to etch alignment markers into the surface of the substrate. The plasma etch may be based on for example Cl/HBr chemistry. The quantum well may be contacted using doped contacts using an implantation step using a dopant, e.g. a n-type dopant, and activated with a rapid thermal anneal at an elevated temperature of 700° C.

A superconducting layer may be deposited on the substrate using well-known deposition techniques. For example, in an embodiment, a superconducting NbTiN film of a thickness between 5 and 10 nm may be deposited using magnetron sputtering. This deposition step may be preceded by a hydrofluoric acid dip and Marangoni drying, and followed by lift-off of the resist-covered quantum dot areas. The sheet inductance of the superconducting film was designed to be around 115 pH per square. Additionally, a dielectric layer may be formed over the superconducting layer. For example, a high-quality dielectric gate oxide, e.g. an $Al_2O_3$ gate oxide, may be realized using atomic layer deposition. Other types of dielectric layers that could be used include $Si_3N_4$ and/or $SiO_2$ dielectric layers which may be deposed over the superconducting layer using well-known deposition techniques.

This step may be followed by wet etching based on a buffered hydrofluoric acid everywhere except for the resist covered quantum dot areas. Contacts to the implanted contact areas, to the NbTiN film and electron beam lithography alignment markers are patterned with Ti/Pt evaporation preceded with buffered hydrofluoric acid dip and followed by lift-off.

Thereafter, the wafer may be diced into pieces for further electron-beam lithography processing. This process may include forming a structured etch mask defining the resonator, inductors, capacitors and gate lines over the thin-film stack including the superconducting film and etching the superconducting film using a reactive ion etching step, e.g. a $SF_6$/He reactive ion etching steps. This way, resonator, inductors, capacitors and gate structures may be formed in a single etch step. FIG. 7B represents an image of the resulting thin-film capacitor structure. As shown in FIGS. 7A and 7B, the etching step may result in a 40 nm step in thin-film stack including the superconducting film, thereby forming the 2D quantum dots and the capacitor structure(s).

The thin-film capacitor may be realized by forming a patterned resist layer over the part of the structured super-conducting film. The patterned resist layer may include an area exposing part of the structured superconducting film defining a capacitor electrode. A silicon nitride layer, e.g. a 30-nm-thick silicon nitride layer, may be formed over the patterned resist layer to form a dielectric over the capacitor electrode. The thickness of the dielectric layer of the thin-film capacitor may be selected based on a desired capacitance value. Typically, thicknesses between 5 and 50 nm may be selected. The sputtering process will isotropically grow a dielectric layer in the parts of the patterned resist layer. Hence, during the sputtering process the dielectric layer will also grow on the sidewalls of the patterned resist layer.

The formation of the dielectric layer is followed by the formation of a metal layer that forms the top electrode of the thin-film capacitor. For example, a 100 nm Au metal layer may be deposited in a directional (anisotropic) deposition step. In this way, in a single lithography and lift-off step the dielectric and top electrode of the capacitor structure may be formed. The deposition of the Au layer may be preceded by a deposition step of a thin Ti layer, e.g. between 2-6 nm to realize good sticking of the Au layer to the silicon nitride layer. The images of FIGS. 7A and 7B clearly show the Au layer that functions as the top electrode of the capacitor structure and a SiN sidewall, which protects the Au layer from electrical contact with the superconducting layer.

The thin-film design described with reference to FIG. 5-7 is just one example of many possible thin-film capacitor designs that can be realized by the embodiments in this application. For example, in an embodiment, the thin-film stack forming the capacitor structure may include a stack of a plurality, e.g. metal or superconducting layers separated by dielectric layers using standard photolithography steps. For example, a thin-film capacitor structure may be formed including a middle capacitor electrode layer which may be formed in the same layer that is also used to form superconductor inductors and electrodes. This middle capacitor electrode layer may be sandwiched between two conductors, a top and bottom conductor, which are electrically separated from the middle conductor by two dielectric layers. In this way, two thin-films may be formed on each side of the superconducting electrode forming a higher-order thin-film filter structure. When using a thin-film stack comprising three conducting layers, a thin-film C-L-C filter structure is formed which is also referred to as a pi-filter.

Figure 8:
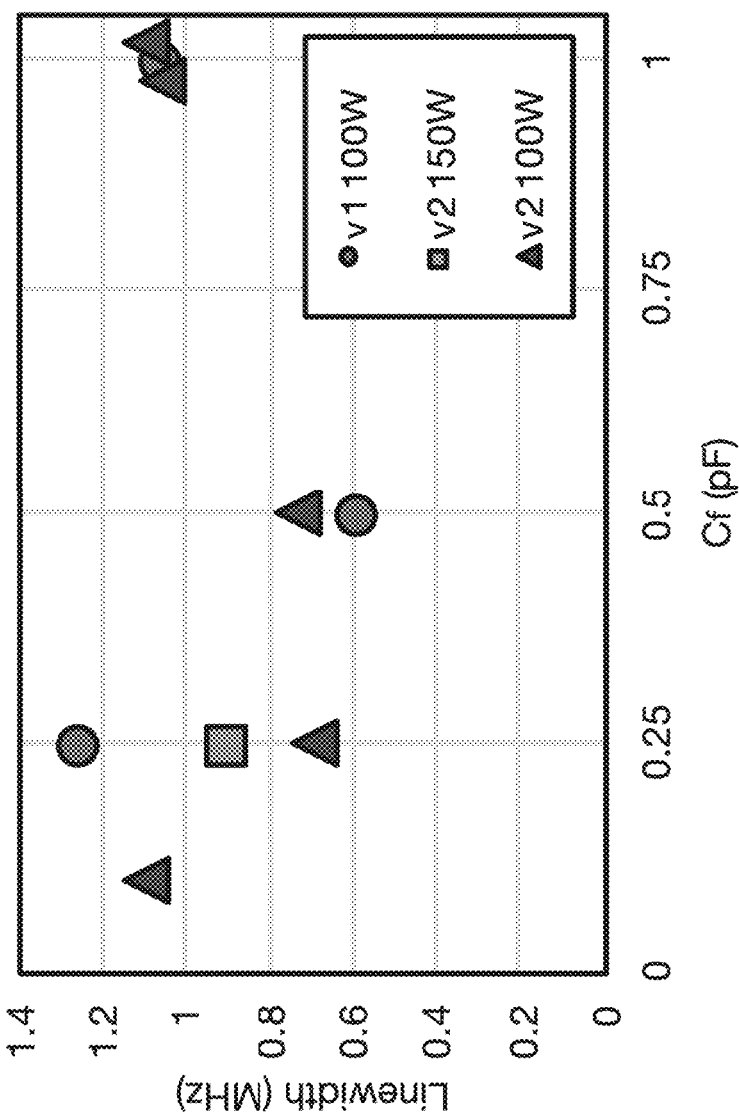
FIG. 8 depicts a graph of the resonant linewidth of an on-chip filtered superconductor resonator for different capacitance values of the filter.

FIG. 8 depicts a graph of resonator linewidths for different capacitance values. In particular, the figure depicts experimentally determined resonator linewidths of a superconducting resonator design including LC filters in the gate and bias electrodes as described with reference to FIGS. 5A and 5B. The experiments were conducted to test the impact of the capacitor area by changing the width of the capacitor. The experimental data also include results from two very slightly different designs (v1 and v2) and the effect of different deposition powers (100 W and 150 W) of the SiN layer that forms the dielectric of the capacitor structure. The reference capacitor $C_f$ has total width 320 μm and length 100 μm, while the SiN thickness is 30 nm. The resonator is designed to have a half-wave mode $\lambda/2$ between 6 and 7.5 GHz that couples the quantum device at each end of the resonator in antiphase, and a quarter-wave mode $\zeta/4$ between 3 and 4 GHz that couples to the quantum devices at both ends in phase. The linewidths of these modes, $\kappa_{\lambda/2}/2\pi$ and $\kappa_{\zeta/4}/2\pi$, respectively, provide a measure for the performance of the filters. The smaller the linewidth, the higher the quality factor and better the performance. Typical values yield $\kappa_{\lambda/2}/2\pi$=0.9 MHz and $\kappa_{\zeta/4}/2\pi$=0.3 MHz for the two modes. FIG. 8 illustrates the results for half-wave mode $\lambda/2$ as a function of the capacitor value which were designed to be in the range between 0.1 and 1 pF. The best performing device achieved $\kappa_{\lambda/2}/2\pi$=0.59 MHz, or a quality factor of 10 900 for a capacitor value of 0.5 pF. The experimental data show that the size of the capacitor does not have large effect on the linewidth.

Thus, the results show that the devices provide resonator linewidths<1 MHz with a plurality of gate lines. These results show substantial improvements compared to known high-impedance resonator designs that provide linewidths>10 MHz (see A. J. Landig, et al, "*Coherent spin-photon coupling using a resonant exchange qubit*," Nature 560, 179 (2018) and P. Scarlino, et al, "*All-microwave control and dispersive readout of gate-defined quantum dot qubits in circuit quantum electrodynamics*," Phys. Rev. Lett. 122, 206802 (2019)). N. Samkharadze, et al, "Strong spin-photon coupling in silicon," Science 359, 1123 (2018) reported better results, however this resonator geometry is not suitable for the coupling of distant qubits.

Although the embodiments describe examples of low-loss, low-pass microwave filters, the invention is by no way limited to such filters but also include other type of filters combining one or more inductors and capacitors in series and/or parallel to form low-pass, high-pass, band-pass or band-reject filters, including high-order filters or filter blocks.

The filter designs allow individual tuning of individual filters by selecting suitable dimensions and geometries of the filter elements, in particular the length of the superconducting nanowire and/or the dimensions of the thin-film capacitor. Additionally, the capacitor values may be tuned by selection of the thickness of the dielectric layer separating the thin-film electrodes and/or selection of the dielectric material of the dielectric layer.

Although the figures illustrate examples of microwave filters that are integrated on the same chip (substrate) as the quantum device, it is submitted that these examples are non-limiting. For example, the invention also includes highly integrated superconducting microwave filter structures on a first substrate that can be connected, e.g. bonded via a micro-bump bonding, to a second substrate comprising the quantum device. Additionally, the invention also includes highly integrated superconducting microwave filter structures on a first plane of the substrate that are connected, e.g. interconnected using metal vias in the substrate to a second plane of the substrate.

Moreover, although the figures illustrate examples of microwave filters that are integrated in the gate electrodes of a quantum dot structure and a superconducting resonator connected to a quantum dot structure, the filter designs are also suitable to be integrated in the leads of other types of qubit structures, including superconducting qubit structures such qubits based on one or more Josephson junctions or a Majorana type topological qubit based on a semiconductor nanowire that is contacted by superconducting leads.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in one hardware unit or provided by a collection of interoperative hardware units, including one or more processors as described above, in conjunction with suitable software and/or firmware.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

15

The invention claimed is:

1. A superconducting device comprising:
a substrate;
at least one superconducting inductor structure between a first terminal and a second terminal disposed on the substrate,
at least one capacitor structure for connecting the second terminal of the superconductor structure to a ground;
the at least one capacitor structure and the at least one superconducting inductor structure forming a low-pass microwave filter structure,
the at least one superconducting inductor structure including one or more nanowires of a superconducting material, and
the at least one capacitor structure comprising one or more first capacitor electrodes and one or more second capacitor electrodes,
wherein one end of each of the one or more nanowires is galvanically connected to one of the one or more first capacitor electrodes and
cross-sectional dimensions of each of the one or more nanowires is selected such that each of the one or more nanowires has a kinetic inductance that is larger than a geometrical inductance of each of the one or more nanowires.

2. The superconducting device according to claim 1, wherein the one or more first capacitor electrodes are made of a superconducting material.

3. The superconducting device according to claim 1 wherein at least one of the one or more first capacitor electrodes and at least one of the one or more second capacitor electrodes form a thin-film interdigitated capacitor.

4. The superconducting device according to claim 1 wherein at least one of the one or more first capacitor electrodes and at least one of the one or more second capacitor electrodes form a thin-film overlap capacitor.

5. The superconducting device according to claim 1, wherein the one or more first capacitor electrodes includes at least a first thin-film capacitor electrode disposed over the substrate and the one or more second capacitor electrodes includes at least a second thin-film capacitor electrode disposed over the first thin-film capacitor electrode, the superconducting device further comprising a dielectric disposed between the first and second thin-film capacitor electrode.

6. The superconducting device according to claim 5 wherein the one or more first thin film capacitor electrodes or the one or more second thin-film capacitor electrodes are made of the same superconducting material as the superconducting material of the one or more nanowires.

7. The superconducting device according to claim 1, wherein the at least one capacitor structure comprises a plurality of first capacitor electrodes and at least one second capacitor electrode, and the superconducting device further comprises a thin-film dielectric layer disposed over the plurality of first capacitor electrodes and a thin-film metal layer disposed over the dielectric thin-film layer, and the thin-film metal layer forming the at least one second electrode of the at least one capacitor structure.

8. The superconducting device according to claim 1, wherein the cross-sectional dimensions of each of the one or more nanowires are selected such that the kinetic inductance of each of the one or more nanowires is at least 10 times larger than the geometrical inductance of each of the one or more nanowires.

9. The superconducting device according to claim 1 wherein the cross-sectional dimensions of each of the one or more nanowires includes a width and a thickness, the width is selected between 10 nm and 800 nm and the thickness is selected between 3 nm and 200 nm.

10. The superconducting device according to claim 1, wherein the superconducting material of the one or more nanowires is selected from the group consisting of NbTiN, NbTi, TiN, NbN, NbSn and Nb.

11. The superconducting device according to claim 1, wherein the cutoff frequency of the low-pass microwave filter structure is selected to be below a frequency selected between 1 GHz and 10 GHz.

12. The superconducting device according to claim 1, further comprising:
at least one quantum dot structure disposed on or in the substrate, and
a plurality of gate electrodes disposed over the substrate to control the quantum dot structure,
wherein each of the plurality of the gate electrodes includes a nanowire section and a width of the gate electrode is reduced to form at least one of the plurality of nanowires of the inductor structure.

13. The superconducting device according to claim 12 wherein the at least one quantum dot structure is a silicon-based quantum dot structure selected from the group consisting of a SiGe quantum dot structure and a silicon-silicon oxide quantum dot structure.

14. The superconducting device according to claim 12 further comprising:
a superconducting resonator structure connected to the at least one quantum dot structure.

15. The superconducting device according to claim 1, wherein the superconducting inductor structure is located at a first area of the substrate and the at least a capacitor structure is located at a second area of the substrate; and/or the low-pass microwave filter structure is a thin-film lumped element filter.

16. The superconducting device according to claim 1, wherein
the one or more first capacitor electrodes are made of a same superconducting material as the one or more nanowires,
the dielectric of the superconducting device is a thin-film dielectric layer,
the cross-sectional dimensions of each of the one or more nanowires are selected such that the kinetic inductance of each of the one or more nanowires is at least 1000 times larger than the geometrical inductance of each of the one or more nanowires,
the width of the one or more nanowires is selected between 50 nm and 300 nm and the thickness of the one or more nanowires is selected between 6 nm and 50 nm, and
the cutoff frequency of the low-pass microwave filter structure is selected to be below a frequency selected between 2 GHz and 8 GHz.

17. A solid-state quantum device comprising:
one or more quantum devices formed on or in a semiconductor substrate;
one or more electrodes connecting bonding pads on the substrate to the one or more quantum devices;
wherein each of the one or more electrodes includes at least one low-pass microwave filter, each said low-pass microwave filter comprising a superconducting inductor structure and a capacitor structure for connecting an electrode of one of the one or more quantum devices to a ground;

the at least one superconducting inductor structure including one or more nanowires of a superconducting material, the at least one capacitor structure comprising one or more first capacitor electrodes and one or more second capacitor electrodes, one end of each of the one or more nanowires is galvanically connected to one of the one or more first capacitor electrodes, and the cross-sectional dimensions of each of the one or more nanowires are selected such that a kinetic inductance of each of the one or more nanowires is larger, than a geometrical inductance of each of the one or more nanowires.

18. The superconducting device according to claim 17 wherein a cut-off frequency of the low-pass microwave filter structure is selected to be below a frequency selected between 1 GHz and 10 GHZ and/or wherein the low-pass microwave filter structure is a thin-film lumped element filter.

19. The superconducting device according to claim 17, wherein the at least one low-pass microwave filter is integrated in an electrode of one of the one or more quantum devices.

20. A method of fabricating a quantum device comprising:
forming a thin-film heterostructure over a substrate;
forming a superconducting layer over the thin-film heterostructure to form a thin-film stack provided on the substrate;
forming a first patterned resist layer over the thin-film stack, the first patterned resist layer including a capacitor pattern, an inductor pattern, a connection pattern connecting the capacitor and inductor pattern and quantum device pattern, the inductor pattern including a nanowire pattern;
forming a capacitor structure, an inductor structure, a connection structure galvanically connecting the inductor structure with the capacitor structure and a quantum device structure in the thin-film stack using an etching step;
forming a second patterned resist layer over the capacitor structure exposing the top surface of the capacitor structure; and,
forming a thin-film capacitor, the forming of the thin-film capacitor including forming a dielectric layer and a metal layer over the second patterned resist layer and removing the second patterned resist layer,
wherein a width of the nanowire and a thickness of the superconducting layer are selected such that a kinetic inductance of the nanowire structure is larger than a geometrical inductance of the nanowire structure.

* * * * *